(12) United States Patent
Sekiya

(10) Patent No.: US 11,096,287 B2
(45) Date of Patent: Aug. 17, 2021

(54) METHOD OF MANUFACTURING PACKAGED BOARD

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 222 days.

(21) Appl. No.: 16/241,285

(22) Filed: Jan. 7, 2019

(65) Prior Publication Data

US 2019/0215966 A1    Jul. 11, 2019

(30) Foreign Application Priority Data

Jan. 10, 2018  (JP) .............................. JP2018-001631

(51) Int. Cl.
| | | |
|---|---|---|
| *H05K 3/00* | (2006.01) | |
| *H05K 3/46* | (2006.01) | |
| *H05K 3/12* | (2006.01) | |
| *H01L 21/78* | (2006.01) | |
| *H05K 3/28* | (2006.01) | |
| *H01L 23/02* | (2006.01) | |
| *H01L 25/00* | (2006.01) | |

(52) U.S. Cl.
CPC .......... *H05K 3/0014* (2013.01); *H01L 21/78* (2013.01); *H01L 23/02* (2013.01); *H01L 25/00* (2013.01); *H05K 3/1283* (2013.01); *H05K 3/284* (2013.01); *H05K 3/4644* (2013.01); *H05K 2203/1316* (2013.01); *H05K 2203/1476* (2013.01)

(58) Field of Classification Search
CPC .... H02K 15/0087; H02K 15/024; H02K 1/16; H02K 2203/09; H02K 3/14
See application file for complete search history.

(56) References Cited

U.S. PATENT DOCUMENTS

| | | | | |
|---|---|---|---|---|
| 5,289,033 | A * | 2/1994 | Asami | ............... B29C 45/14655 257/676 |
| 5,998,243 | A * | 12/1999 | Odashima | ......... B29C 45/14655 438/127 |
| 6,708,401 | B2 * | 3/2004 | Miyakawa | ............. H05K 3/284 29/832 |
| 2019/0215966 | A1 * | 7/2019 | Sekiya | .................... H05K 3/284 |
| 2020/0273767 | A1 * | 8/2020 | Ory | ..................... H01L 23/3114 |

FOREIGN PATENT DOCUMENTS

JP        2006032471 A      2/2006

* cited by examiner

*Primary Examiner* — Minh N Trinh

(74) *Attorney, Agent, or Firm* — Greer Burns & Crain Ltd.

(57) ABSTRACT

A method of manufacturing a packaged board includes the steps of blanketing a wiring board with devices disposed thereon in a molding die and supplying the molding resin to the molding die, provisionally sintering the molding resin at a relatively low provisional sintering temperature below a final sintering temperature, detaching the wiring board from the molding die, and thereafter, placing the wiring board on a first base having a first flat surface, pressing the wiring board with a second base having a second flat surface parallel to the first flat surface, and heating the wiring board at the final sintering temperature to finally sinter the provisionally sintered molding resin while keeping its thickness uniform.

5 Claims, 5 Drawing Sheets

METHOD OF MANUFACTURING PACKAGED BOARD

BACKGROUND OF THE INVENTION

Field of the Invention

The present invention relates to a method of manufacturing a packaged board including a plurality of devices disposed in respective areas on a wiring board that are demarcated by a grid of projected dicing lines and have respective wiring patterns corresponding to the devices, and sealed by a molding resin.

Description of the Related Art

Wafers having a plurality of devices such as integrated circuits (ICs), large scale integration (LSI) circuits, or the like formed on areas on face sides thereof that are demarcated by a grid of projected dicing lines are divided into individual device chips by a dicing apparatus, a laser processing apparatus, or the like. The divided individual device chips will be used in electric appliances including mobile phones, personal computers, and so on. Some device chips are used in a form referred to as chip size package (CSP) where they are sealed by a molding resin (see, for example, Japanese Patent Laid-Open No. 2006-32471).

SUMMARY OF THE INVENTION

Packaged boards are formed by blanketing wiring boards in molding dies and supplying the molding dies with a molding resin to package a plurality of devices. However, such packaged boards may not necessarily be uniform in thickness and may suffer instances of quality instability.

It is therefore an object of the present invention to provide a method of manufacturing a packaged board having a uniform thickness.

In accordance with an aspect of the present invention, there is provided a method of manufacturing a packaged board including a plurality of devices disposed in respective areas on a wiring board that are demarcated by a grid of projected dicing lines and have respective wiring patterns corresponding to the devices, and sealed by a molding resin. The method includes the steps of blanketing the wiring board with the devices disposed thereon in a molding die and supplying the molding resin to the molding die, provisionally sintering the molding resin at a relatively low provisional sintering temperature below a final sintering temperature, thereafter, detaching the wiring board from the molding die, and thereafter, placing the wiring board on a first base having a first flat surface, pressing the wiring board with a second base having a second flat surface parallel to the first flat surface, and heating the wiring board at the final sintering temperature to finally sinter the provisionally sintered molding resin while keeping its thickness uniform.

Preferably, the wiring patterns included in the wiring board are classified into two or more groups. Further preferably, the molding resin includes a liquid epoxy resin, the provisional sintering temperature ranges from 160 to 180° C., and the final sintering temperature ranges from 250 to 270° C.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
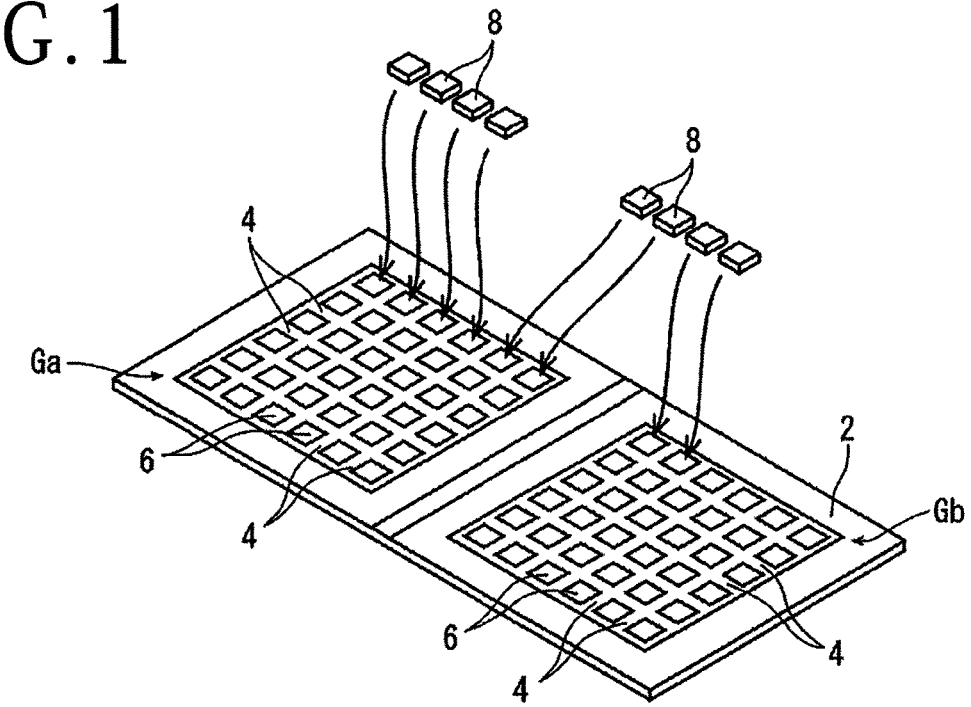
FIG. 1 is a perspective view illustrating the manner in which a plurality of devices are placed on a wiring board.
Figure 2:
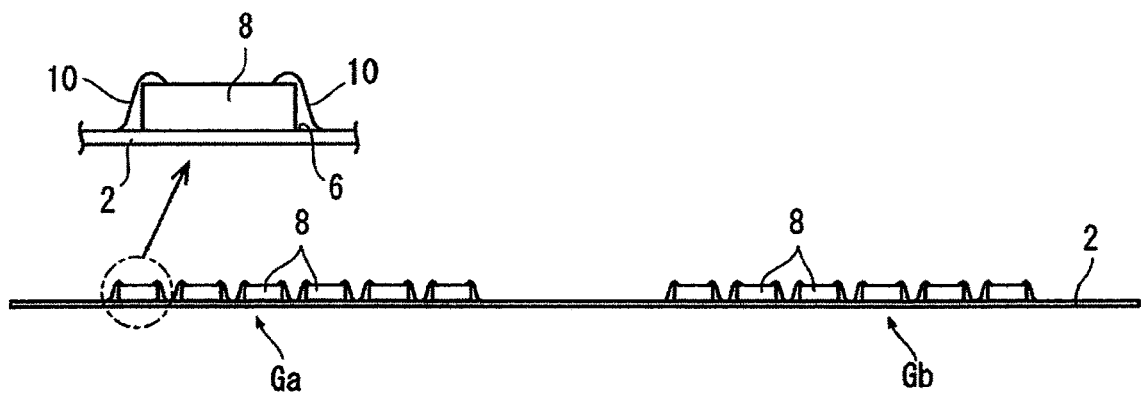
FIG. 2 is a front elevational view of the wiring board with the devices disposed thereon.
Figure 3:
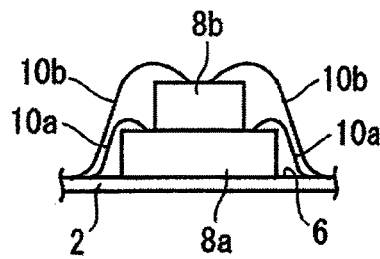
FIG. 3 is an enlarged fragmentary front elevational view of a wiring board on which devices are stacked in two tiers.

A method of manufacturing a packaged board according to an embodiment of the present invention will be described in specific detail below with reference to the drawings. As illustrated in FIG. 1, a wiring board 2 is demarcated into a plurality of rectangular areas 6 by a grid of projected dicing lines 4 thereon. Each of the rectangular areas 6 has a wiring pattern, not depicted, corresponding to a device 8 to be mounted thereon. The wiring board 2 according to the present embodiment includes a plurality of wiring patterns divided into two groups, i.e., a first group Ga and a second group Gb. However, the wiring patterns included in the wiring board 2 for devices 8 may be classified into a single group or three or more groups. As illustrated in FIGS. 1 and 2, devices 8 are disposed respectively in the rectangular areas 6. The devices 8 have connection terminals, not depicted, connected to electrodes, not depicted, of the wiring patterns on the respective rectangular areas 6 by wires 10. As illustrated in FIG. 3, devices 8a and 8b may be stacked in two tiers on each of the rectangular areas 6. According to such an alternative, the devices 8a and 8b have connection terminals connected to the electrodes of the wiring patterns by wires 10a and 10b, respectively. Further alternatively, devices may be stacked in three or more tiers on each of the rectangular areas 6. The connection terminals of the devices 8 may be connected to the electrodes of the wiring patterns by ball electrodes, not depicted.

Figure 4:
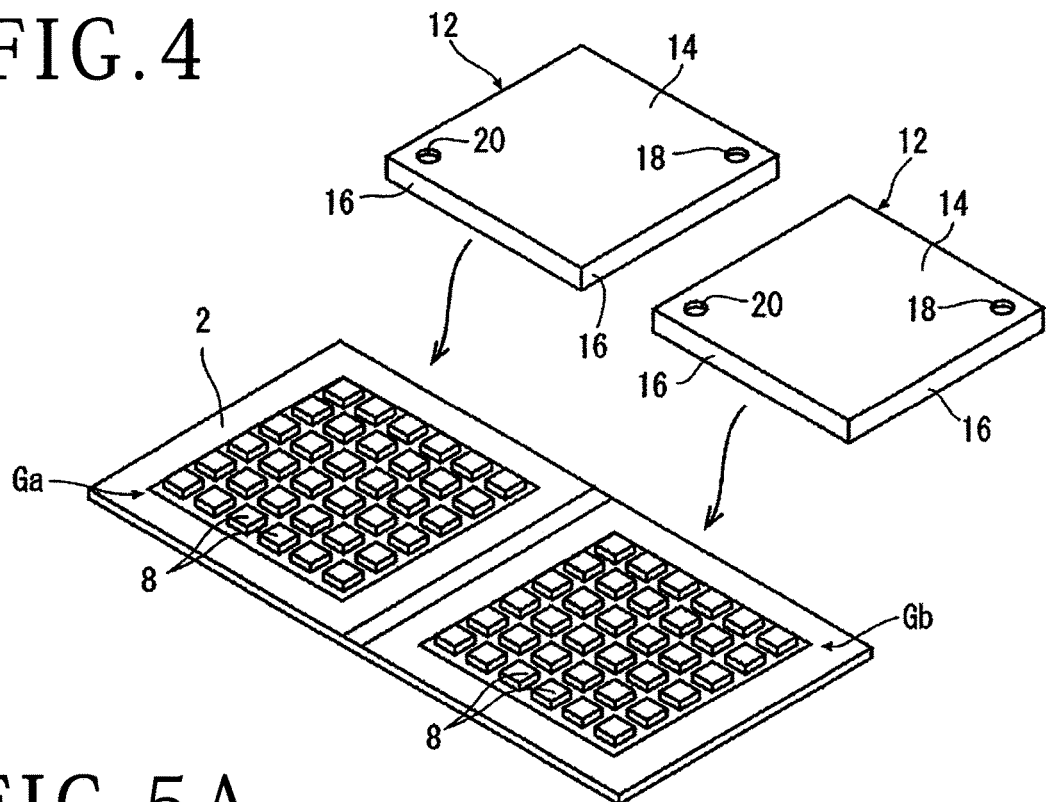
FIG. 4 is a perspective view of a wiring board with a plurality of devices disposed thereon and a pair of molding dies to be placed on the wiring board.
Figure 5A:
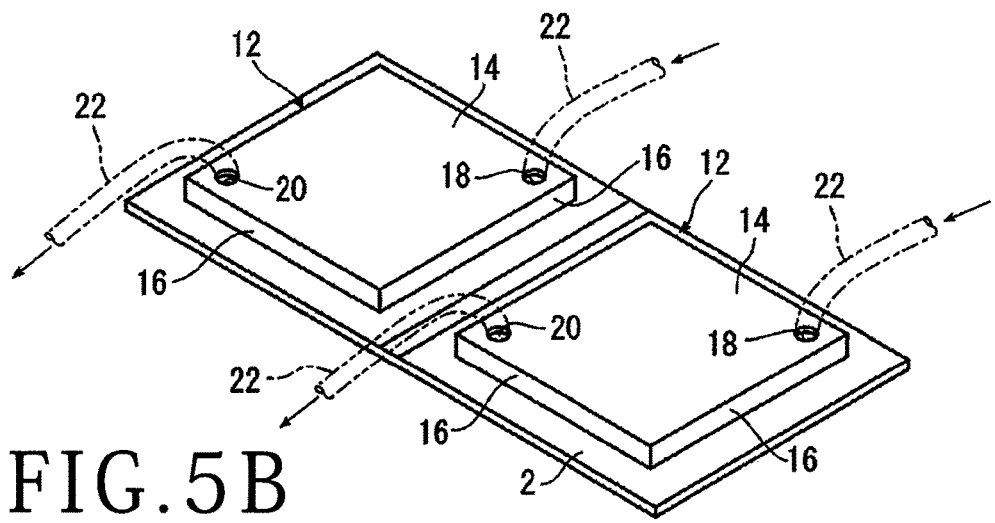
FIG. 5A is a perspective view illustrating the manner in which a molding resin supplying step is carried out on the wiring board.
Figure 5B:
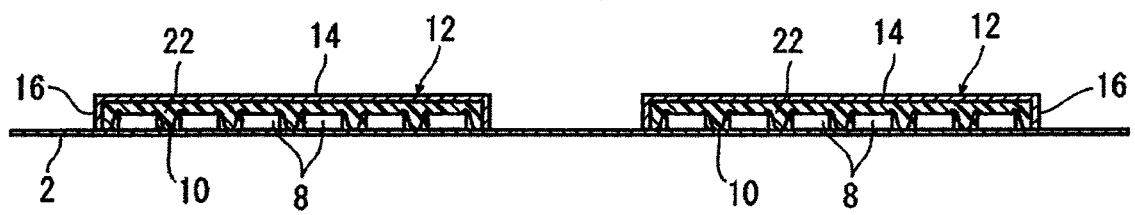
FIG. 5B is a cross-sectional view of the wiring board after the molding resin supplying step has been carried out thereon.

In the method according to the present embodiment, a molding rein supplying step is initially carried out to blanket the wiring board 2 with the devices 8 disposed thereon in molding dies and supply the molding dies with a molding resin. Specifically, as illustrated in FIG. 4, a pair of molding dies 12 are placed on the wiring board 2. Each of the molding dies 12 includes a rectangular upper wall 14 and four side walls 16 hanging from the peripheral edges of the upper wall 14, with a lower open end opposite the upper wall 14. The upper wall 14 has a supply opening 18 defined therein for supplying a molding resin and a discharge opening 20 defined therein for discharging an excess of the supplied molding resin. In the molding resin supplying step, as illustrated in FIGS. 4 and 5A, the molding dies 12 are placed on the surface of the wiring board 2 on which the devices 8 are disposed in covering relation to the devices 8, blanketing the wiring board 2 in the molding dies 12. Then, a space defined between the inner surfaces of the molding dies 12 and the surface of the wiring board 2 on which the devices 8 are disposed is supplied and filled with a molding resin 22 such as a liquid epoxy resin or the like through the supply openings 18. Any excess of the molding resin 22 supplied to the space through the supply openings 18 is discharged through the discharge openings 20. As illustrated in FIG. 5B, the devices 8 disposed on the wiring board 2 are sealed by the molding resin 22. The molding resin 22 may be mixed with a filler of silica which has a particle diameter of approximately several tens μm for increased rigidity and thermal conductivity.

Figure 6:
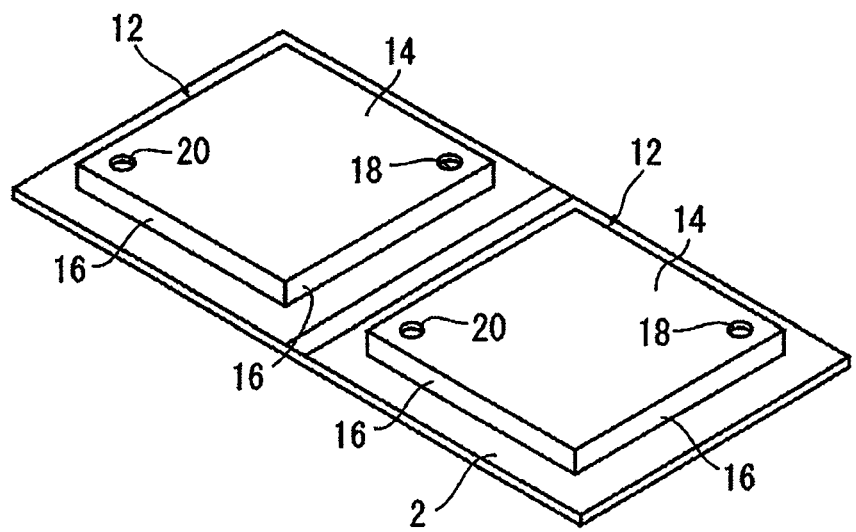
FIG. 6 is a perspective view of the wiring board in a state to be provisionally sintered.

After the molding resin supplying step has been carried out, a provisional sintering step is carried out to provisionally sinter the molding resin 22 at a relatively low provisional sintering temperature below a final sintering temperature. The provisional sintering step is performed while the wiring board 2 is being covered with the molding dies 12, as illustrated in FIG. 6, in order to prevent the molding resin 22 from being deformed during the provisional sintering step. If the molding resin 22 supplied in the molding resin supplying step is a liquid epoxy resin, for example, then the provisional sintering step is carried out at a temperature ranging from approximately 160 to 180° C. for a period of time ranging from approximately 15 to 20 minutes. The molding resin 22 that is thus provisionally sintered at a relatively low provisional sintering temperature below a final sintering temperature is cured to the extent that the molding resin 22 remains shaped complementarily to the molding dies 12 even after the wiring board 2 is detached from the molding dies 12 though the molding resin 22 may possibly not be fully cured and may possibly be subject to deformation.

Figure 7:
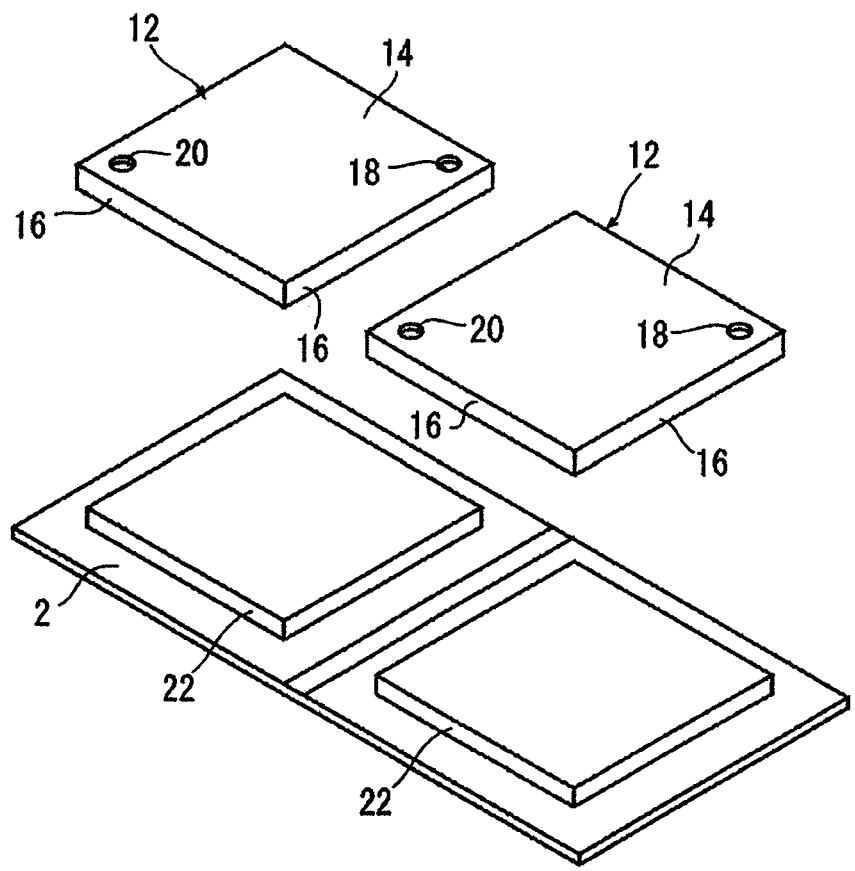
FIG. 7 is a perspective view of the wiring board that has been detached from the molding dies.

The provisional sintering step is followed by a molding die detaching step to detach the wiring board 2 from the molding dies 12, as illustrated in FIG. 7.

Figure 8:
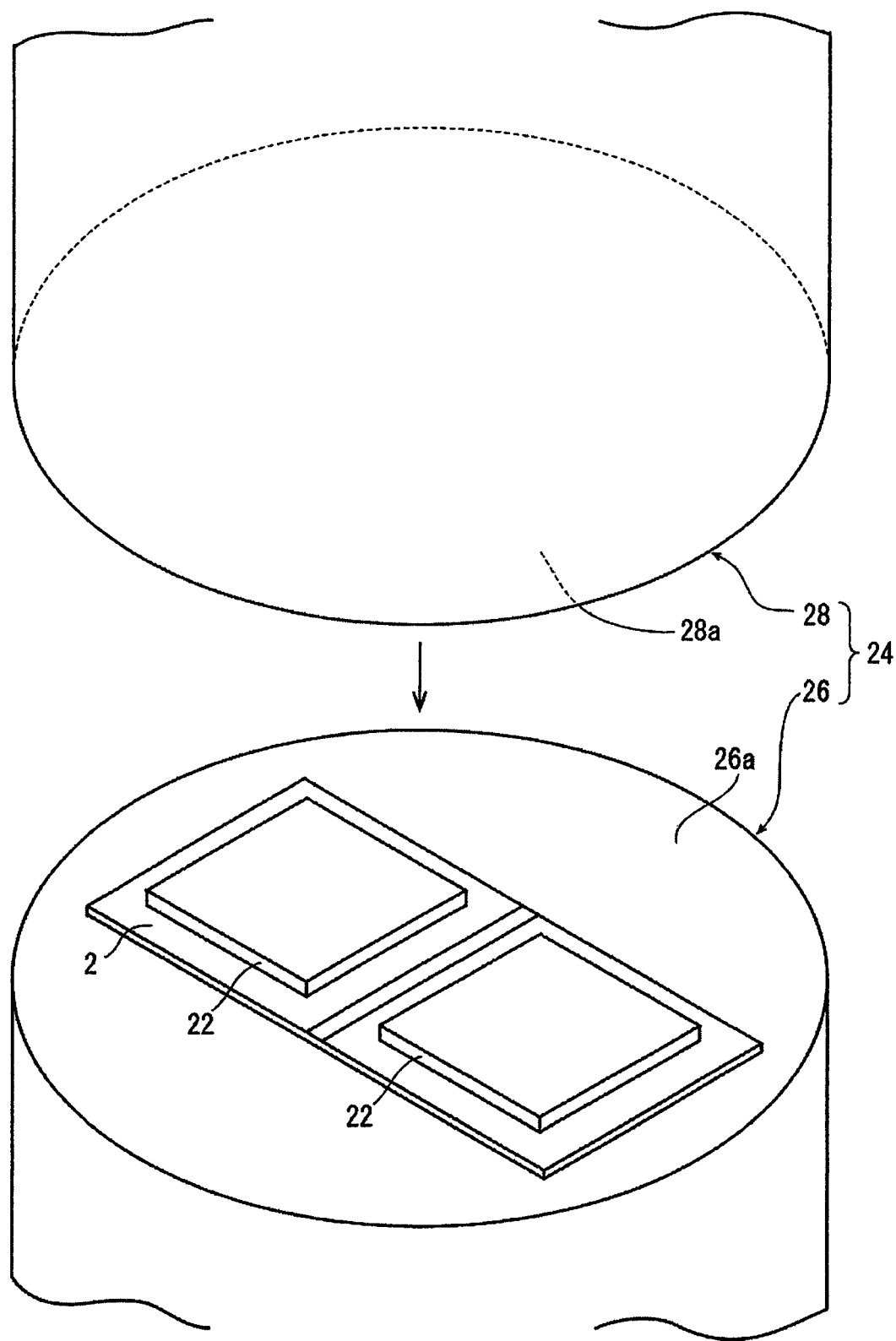
FIG. 8 is a perspective view illustrating the manner in which a final sintering step is carried out on the wiring board.

After the molding die detaching step has been carried out, a final sintering step is carried out to place the wiring board 2 on a first base having a first flat surface, to press the wiring board 2 with a second base having a second flat surface parallel to the first flat surface, and to heat the wiring board 2 at the final sintering temperature to finally sinter the provisionally sintered molding resin 22 while keeping its thickness uniform. The final sintering step may be performed using a pressing apparatus 24 part of which is illustrated in FIG. 8. As illustrated in FIG. 8, the pressing apparatus 24 includes a first cylindrical base 26 having a first flat surface 26a on its upper end and a second cylindrical base 28 having a second flat surface 28a on its lower end that lies parallel to the first flat surface 26a. The first base 26 is fixedly mounted on a floor. The second base 28 is vertically movable toward and away from the first base 26 by lifting and lowering means, not depicted, such as a hydraulic cylinder or the like. The second base 28 incorporates therein a heater, not depicted, for heating the second flat surface 28a. The second flat surface 28a is made of a metal material such as aluminum alloy, copper alloy, or the like having relatively high thermal conductivity.

Figure 9:
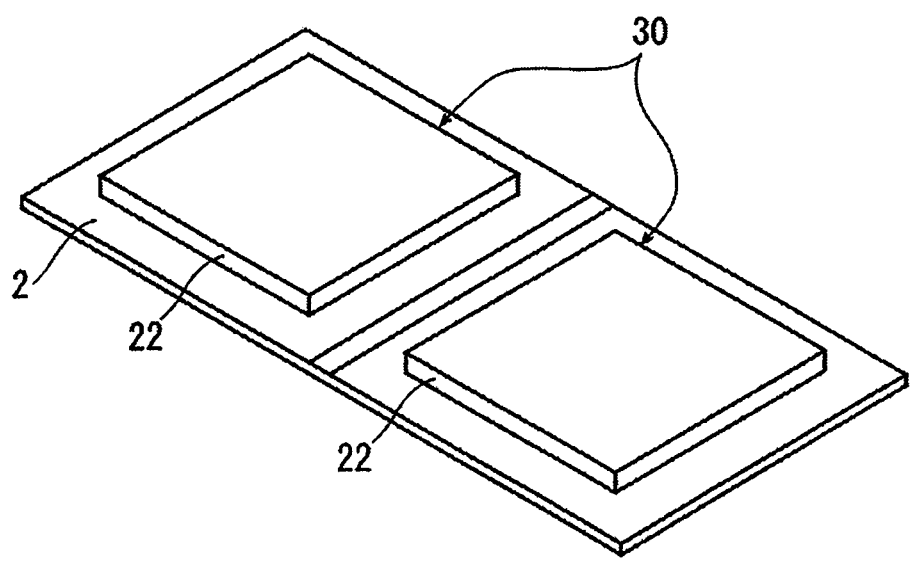
FIG. 9 is a perspective view of a manufactured packaged board.

In the final sintering step, as illustrated in FIG. 8, the wiring board 2 with the molding resin 22 facing upwardly is placed on the first flat surface 26a. Then, the lifting and lowering means lowers the second base 28 to cause the second flat surface 28a to press the molding resin 22. The heater in the second base 28 is energized to heat the molding resin 22 at the final sintering temperature higher than the provisional sintering temperature and for a period of time longer than the provisional sintering period of time. If the molding resin 22 supplied in the molding resin supplying step is a liquid epoxy resin, for example, then the final sintering step is performed at a temperature ranging from approximately 250 to 270° C. for a period of time ranging from approximately 20 to 25 minutes. The second flat surface 28a may press the molding resin 22 under a pressure ranging from approximately 0.5 to 1.0 N/cm². In the final sintering step thus performed, the molding resin 22 is fully cured and has its thickness made uniform. As a result, a packaged board 30 with a uniform thickness is manufactured as illustrated in FIG. 9.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of sealing a packaged board, the packaged board including a plurality of devices disposed in respective areas on a wiring board that are demarcated by a grid of projected dicing lines and have respective wiring patterns corresponding to the devices, the method comprising steps of:

covering the devices disposed on the wiring board with a molding die and sealing the plurality of devices disposed on the wiring board in the molding die by supplying a molding resin into the molding die through a supply opening formed in the molding die to form a plurality of sealed devices disposed on the wiring board;

provisionally sintering the molding resin in the molding die at a relatively low provisional sintering temperature to prevent the molding resin formed on the wiring board from being deformed;

thereafter, detaching the molding die from the provisionally sintered molding resin formed on the wiring board; and finally sintering the wiring board by moving the wiring board into a pressing apparatus to press and finally sinter the wiring board, wherein the wiring board is placed on a first base of the pressing apparatus having a first flat surface, the provisionally sintered molding resin is pressed against the first base with a second base of the pressing apparatus having a second flat surface parallel to the first flat surface, and the provisionally sintered molding resin is heated through the second flat surface at a final sintering temperature, higher than the provisional sintering temperature, to finally sinter the provisionally sintered molding resin while keeping a thickness of the finally sintered molding resin uniform to form the packaged board.

2. The method according to claim 1, wherein the wiring patterns included in the wiring board are classified into two or more groups.

3. The method according to claim 1, wherein the molding resin includes a liquid epoxy resin, the provisional sintering temperature ranges from 160 to 180° C., and the final sintering temperature ranges from 250 to 270° C.

4. The method according to claim 1, wherein the second flat surface presses the provisionally sintered molding resin under a pressure ranging from approximately 0.5 to 1.0 N/cm².

5. The method according to claim 1, wherein the molding die includes a top surface parallel to the surface of the wiring board on which the devices are disposed and a plurality of side walls extending from the top surface.

* * * * *